US008921189B2

(12) United States Patent
Yu et al.

(10) Patent No.: US 8,921,189 B2
(45) Date of Patent: Dec. 30, 2014

(54) METHOD FOR FABRICATING SEMICONDUCTOR DEVICE

(75) Inventors: Jae-Seon Yu, Kyoungki-do (KR); Sang-Rok Oh, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1299 days.

(21) Appl. No.: 12/005,438

(22) Filed: Dec. 26, 2007

(65) Prior Publication Data

US 2008/0160739 A1 Jul. 3, 2008

(30) Foreign Application Priority Data

Dec. 27, 2006 (KR) ........................ 10-2006-0134353

(51) Int. Cl.
*H01L 21/28* (2006.01)
*H01L 27/105* (2006.01)

(52) U.S. Cl.
CPC .......... *H01L 27/105* (2013.01); *H01L 27/1052* (2013.01)
USPC ........... 438/299; 438/734; 438/759; 438/761; 438/694; 438/585; 438/595; 438/696

(58) Field of Classification Search
None
See application file for complete search history.

(56) References Cited

U.S. PATENT DOCUMENTS

| | | | | |
|---|---|---|---|---|
| 5,296,258 A * | 3/1994 | Tay et al. | | 438/322 |
| 6,025,117 A * | 2/2000 | Nakano et al. | | 430/314 |
| 6,235,574 B1 * | 5/2001 | Tobben et al. | | 438/241 |
| 6,261,965 B1 * | 7/2001 | Sekiyama | | 438/706 |
| 6,342,416 B1 * | 1/2002 | Kim et al. | | 438/239 |
| 6,468,852 B1 * | 10/2002 | Gonzalez et al. | | 438/217 |
| 7,012,003 B2 * | 3/2006 | Tobben | | 438/257 |
| 7,179,749 B2 * | 2/2007 | Lee et al. | | 438/706 |
| 7,220,683 B2 * | 5/2007 | Yin et al. | | 438/780 |
| 7,265,051 B2 * | 9/2007 | Kim et al. | | 438/672 |
| 2001/0005634 A1 * | 6/2001 | Kajiwara | | 438/706 |
| 2001/0038113 A1 * | 11/2001 | Bronner et al. | | 257/301 |
| 2002/0053690 A1 * | 5/2002 | Kim et al. | | 257/296 |
| 2003/0042517 A1 * | 3/2003 | Stottko et al. | | 257/288 |
| 2003/0082862 A1 * | 5/2003 | Richter et al. | | 438/197 |
| 2003/0151082 A1 * | 8/2003 | Kim et al. | | 257/306 |
| 2005/0020009 A1 * | 1/2005 | Tobben | | 438/257 |
| 2005/0056835 A1 * | 3/2005 | Yin et al. | | 257/52 |
| 2005/0287809 A1 * | 12/2005 | Lee et al. | | 438/689 |

(Continued)

FOREIGN PATENT DOCUMENTS

| | | |
|---|---|---|
| CN | 1722409 | 1/2006 |
| CN | 1879201 | 12/2006 |

(Continued)

*Primary Examiner* — David E Graybill
(74) *Attorney, Agent, or Firm* — Blakely Sokoloff Taylor & Zafman

(57) ABSTRACT

A method for fabricating a semiconductor device including a first region and a second region, wherein pattern density of etch target patterns formed in the second region is lower than that of etch target patterns formed in the first region includes providing a substrate including the first region and the second region, forming an etch target layer over the substrate, forming a hard mask layer over the etch target layer, etching the hard mask layer to form a first and a second hard mask pattern in the first and the second regions, respectively, reducing a width of the second hard mask pattern formed in the second region and etching the etch target layer using the first hard mask pattern and the second hard mask pattern having the reduced width as an etch barrier to form the etch target patterns in the first and the second regions.

14 Claims, 3 Drawing Sheets

(56) References Cited

U.S. PATENT DOCUMENTS

| | | | |
|---|---|---|---|
| 2006/0024884 A1* | 2/2006 | Kim et al. | 438/253 |
| 2006/0024969 A1* | 2/2006 | Shive et al. | 438/706 |
| 2006/0170029 A1* | 8/2006 | Liu et al. | 257/315 |
| 2006/0214200 A1* | 9/2006 | Nonaka et al. | 257/292 |
| 2006/0239869 A1* | 10/2006 | Irie et al. | 422/105 |
| 2006/0263528 A1* | 11/2006 | Tiwari | 427/304 |
| 2007/0096145 A1* | 5/2007 | Watanabe | 257/134 |
| 2007/0272975 A1* | 11/2007 | Schaeffer et al. | 257/327 |
| 2008/0020570 A1* | 1/2008 | Naik | 438/675 |
| 2008/0026529 A1* | 1/2008 | White et al. | 438/275 |
| 2008/0102643 A1* | 5/2008 | Chen et al. | 438/710 |
| 2008/0112231 A1* | 5/2008 | Shum | 365/185.27 |
| 2008/0160739 A1* | 7/2008 | Yu et al. | 438/585 |

FOREIGN PATENT DOCUMENTS

| | | | | | |
|---|---|---|---|---|---|
| JP | 2000031123 A | * | 1/2000 | | H01L 21/3065 |
| JP | 2005109035 A | * | 4/2005 | | H01L 21/3065 |
| KR | 20050070320 | | 7/2005 | | |
| KR | 10 2006 0020227 A | | 3/2006 | | |

* cited by examiner

METHOD FOR FABRICATING SEMICONDUCTOR DEVICE

CROSS-REFERENCE TO RELATED APPLICATIONS

The present invention claims priority to Korean patent application number 2006-0134353, filed on Dec. 27, 2007, which is incorporated by reference in its entirety.

BACKGROUND OF THE INVENTION

The present invention relates to a method for fabricating a semiconductor device, and more particularly, to an etching method using a hard mask scheme in regions having different pattern densities.

As semiconductor devices become more highly integrated, a critical dimension (CD) of a gate is getting reduced. The reduction of the CD is required not only in a memory cell region but also in a peripheral region where driving circuits for driving cells, logical devices such as a decoder and a sense amplifier are formed.

Generally, a hard mask scheme is applied to a gate etch process for forming a gate of a semiconductor device. According to the hard mask scheme, a hard mask having a pattern substantially the same as a photoresist pattern which is used as an etch mask is formed under the photoresist pattern to compensate limitations of the photoresist pattern. Then, after removing the photoresist pattern, the hard mask is used as an etch mask for the gate etch process.

However, when etching a nitride layer for the hard mask during the gate etch process, a loading effect caused by the pattern density difference increases a final inspection critical dimension (FICD) of the peripheral region compared to the cell region. Even when the identical DICDs are applied to the cell region and the peripheral region, the loading effect increases the FICD compared to a develop inspection critical dimension (DICD) of the peripheral region.

Thus, it is required to reduce the DICD of the peripheral region as much as an etch CD bias corresponding to a variation value of the FICD. However, in this case, when a photoexposure process is performed using a photo mask, a margin decreases. As a result, a pattern failure such as a collapse of the pattern in the peripheral region occurs. Furthermore, as a linewidth of the semiconductor device decreases, the gate FICD of the peripheral region decreases. Accordingly, it is required to reduce the DICD of the peripheral region as much as the etch CD bias. Therefore, the photolithography process margin decreases, making it difficult to form the patterns.

SUMMARY OF THE INVENTION

Embodiments of the present invention are directed to provide a method for fabricating a semiconductor device which prevents the increase of a gate final inspection critical dimension (FICD) difference between a region having a high pattern density, i.e., a memory cell region, and a region having a low pattern density, i.e., a peripheral region.

In accordance with an aspect of the present invention, there is provided a method for fabricating a semiconductor device including a first region and a second region, wherein pattern density of etch target patterns formed in the second region is lower than that of etch target patterns formed in the first region. The method includes providing a substrate including the first region and the second region, forming an etch target layer over the substrate, forming a hard mask layer over the etch target layer, etching the hard mask layer to form a first and a second hard mask pattern in the first and the second regions, respectively, reducing a width of the second hard mask pattern formed in the second region and etching the etch target layer using the first hard mask pattern and the second hard mask pattern having the reduced width as an etch barrier to form the etch target patterns in the first and the second regions.

DESCRIPTION OF SPECIFIC EMBODIMENTS

Figure 1A:
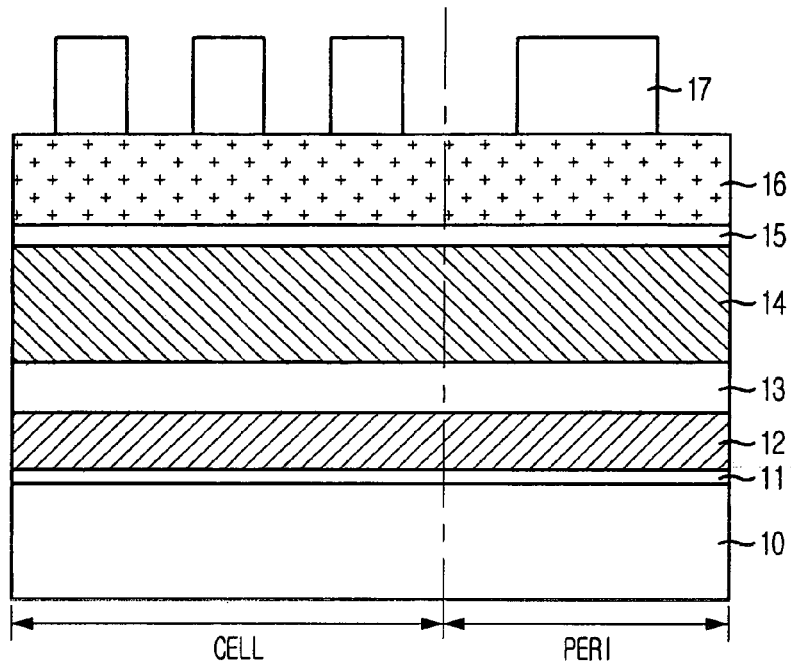
FIGS. 1A to 1F illustrate cross-sectional views of a method for fabricating a semiconductor device in accordance with the embodiment of this invention.

Embodiments of the present invention relate to a method for fabricating semiconductor device.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals throughout the various embodiments of the present invention represent the same or similar elements in different drawings.

FIGS. 1A to 1F illustrate cross-sectional views of a method for fabricating a semiconductor device in accordance with an embodiment of the present invention.

Referring to FIG. 1A, there is provided a substrate 10 including a memory cell region CELL and a peripheral region PERI. The substrate 10 includes a silicon on insulator (SOI) substrate or an inexpensive bulk substrate.

Subsequently, a gate insulation layer 11 is formed over the substrate 10. The gate insulation layer 11 includes a silicon oxide ($SiO_2$) layer, a stack structure of a silicon oxide layer and a nitride layer, or a metal oxide layer such as a hafnium oxide ($HfO_2$) layer, a zirconia ($ZrO_2$) layer, and an aluminum oxide ($AlO_3$) layer, which has a higher permittivity than a silicon oxide layer. For instance, when forming the gate insulation layer 11 using the $SiO_2$ layer, it can be accomplished by a wet oxidation, a dry oxidation, or a radical oxidation process.

Then, a gate conductive layer 12 is formed over the gate insulation layer 11. At this time, the gate conductive layer 12 includes a doped polysilicon layer and an un-doped polysilicon layer. For example, the un-doped polysilicon layer is formed by a low pressure chemical vapor deposition (LPCVD) method using silane ($SiH_4$) gas. A gate metal layer 13 is formed to reduce a resistivity of a gate electrode.

At this time, the gate metal layer 13 includes one selected from a group consisting of transition metal, rare earth metal, and an alloy thereof, or has a stack structure thereof. Also, the gate metal layer 13 may include oxide material, nitride material, or silicide of the transition metal, rare earth metal or the alloy thereof. For instance, the gate metal layer 13 may have a stack structure of a tungsten (W) layer and a tungsten silicide (WSi) layer or a stack structure of a W layer, a tungsten nitride (WN) layer, and a WSi layer.

A nitride layer 14 is formed over the gate metal layer 13 as a gate hard mask layer.

A titanium nitride layer (TiN) 15 is formed over the nitride layer 14 as a hard mask layer. Besides the TiN layer, the hard mask layer can be formed with one of a titanium (Ti)/TiN layer, a tetrachlorotitanium (TiCl$_4$) layer, a W layer, a WN layer, and a Al$_2$O$_3$ layer.

A silicon rich-carbon (SRC) layer 16 including a large amount of silicon, i.e., including more than 10% of silicon, is formed over the TiN layer 15 as a second hard mask layer. The SRC layer 16 functions as an anti-reflective coating (ARC) layer. Thus, it is not required to separately from an organic-based ARC layer.

A photolithography process is performed on the SCR layer 16 to form photoresist patterns 17 for a gate etch mask.

Figure 1B:
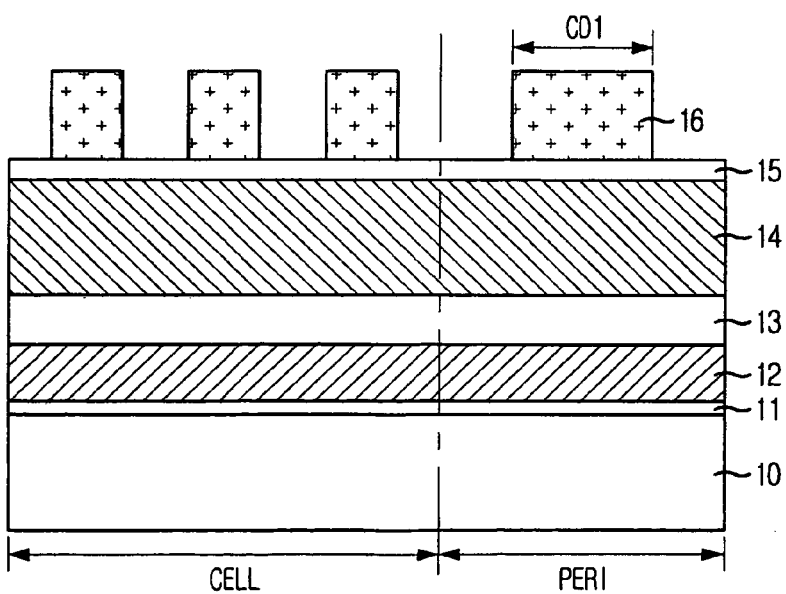

Referring to FIG. 1B, the SRC layer 16 is etched using the photoresist patterns 17 shown in FIG. 1A as an etch mask to form first and second hard mask patterns in the cell region CELL and peripheral region PERI, respectively. The etch process is performed by using a reactive ion etching (RIE) or a magnetically enhanced RIE (MERIE) method and using CF$_4$ and O$_2$ gases. In addition, one of C$_x$F$_y$, C$_x$H$_y$F$_z$, nitrogen trifluoride (NF$_3$), chlorine (Cl$_2$), or trichloroborane (BCl$_3$) gas, or a gas mixture thereof is used, wherein x, y and z are natural numbers. Then, the photoresist patterns 17 are removed.

Figure 1C:
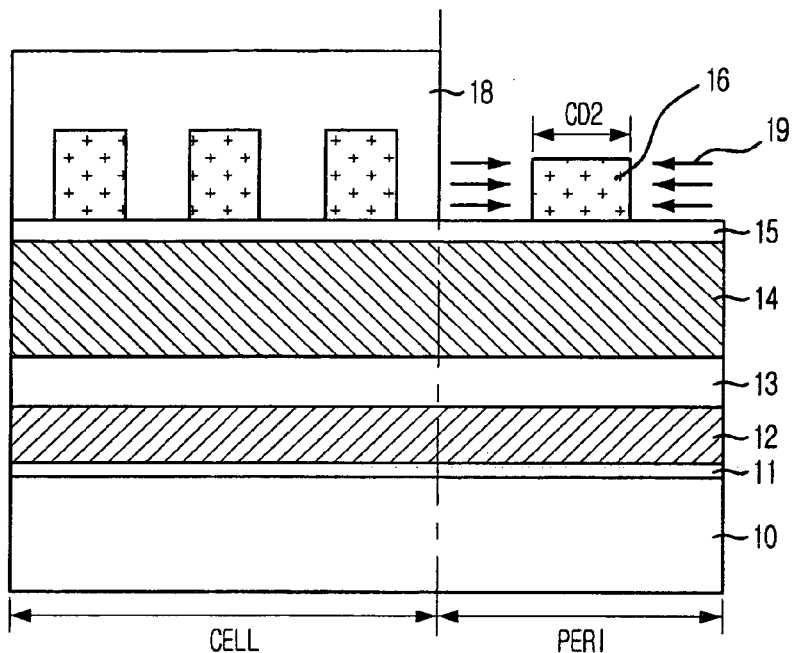

Referring to FIG. 1C, a photolithography process is performed to form photoresist patterns 18 covering the cell region CELL and exposing the peripheral region PERI.

Only the SCR layer 16 formed in the peripheral region PERI is selectively etched using the photoresist patterns 18 as an etch mask. The etch process 19 is preferably an isotropic etch using the RIE or the MERIE method. In the etch process 19, tetrafluoromethane (CF$_4$) and oxygen (O$_2$) gases having a higher etch selectivity to the TiN layer 15 are used to prevent a loss of the TiN layer 15. In addition, one of C$_x$F$_y$, C$_x$H$_y$F$_z$, NF$_3$, Cl$_2$, or BCl$_3$ gas is used alone, or a gas mixture including the above gases is used, wherein x, y and z are natural numbers. Also, for the isotropic etch process, a bias power lower than approximately 300 W, preferably ranging from approximately 100 W to approximately 300 W, is applied separately from a source power. In this manner, the width of the second hard mask pattern is reduced resulting in the CD of the SRC layer 16 formed in the peripheral region PERI being reduced. That is, in the peripheral region PERI, a CD of the SRC layer 16, CD1, in FIG. 1B is longer than a CD of the SRC layer 16, CD2, in FIG. 1C. Meanwhile, the CD of the SRC layer 16 does not vary in the cell region CELL.

Figure 1D:
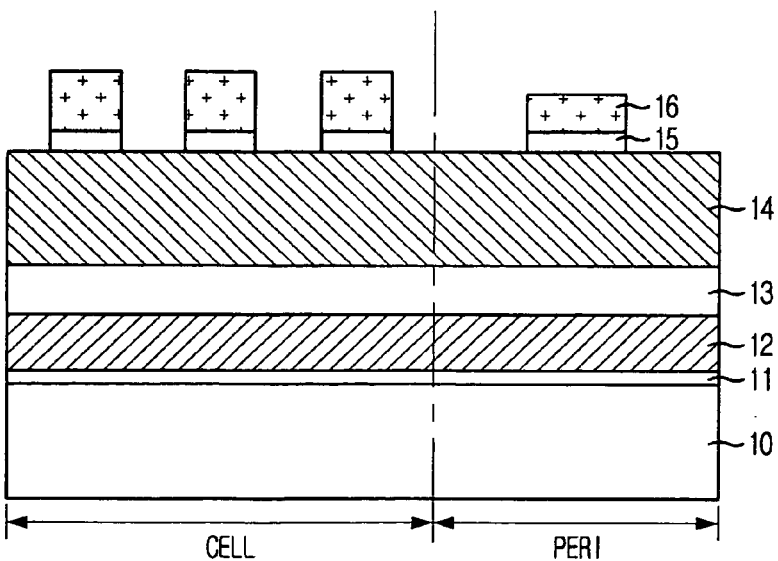

Referring to FIG. 1D, the photoresist patterns 18 (refer to FIG. 1C) are removed. When removing the photoresist patterns 18, it is preferable to use plasma O$_2$ gas, a gas mixture of N$_2$/O$_2$, or a gas mixture of N$_2$/O$_2$/H$_2$ to prevent the SRC layer 16 from being damaged.

The TiN layer 15 is etched using the SRC layer 16 as an etch barrier. The etch process is performed using Cl$_2$, BCl$_3$, CH$_4$, or N$_2$ gas.

Figure 1E:
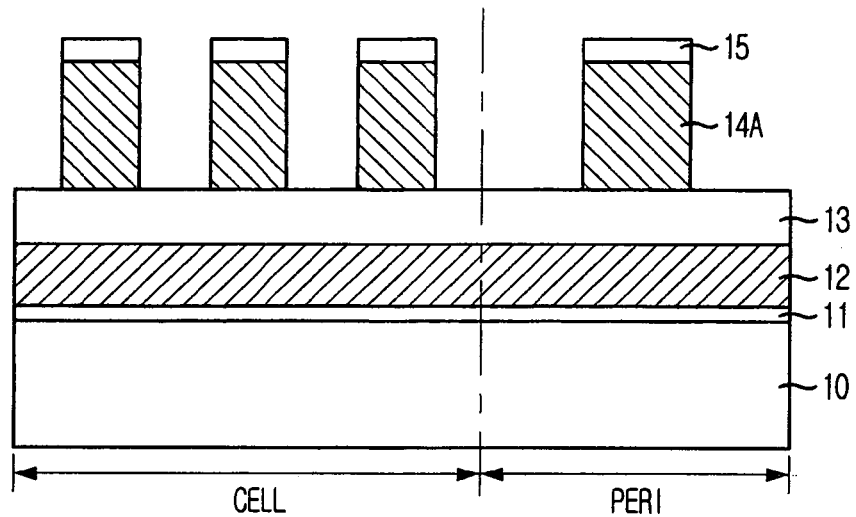

Referring to FIG. 1E, the nitride layer 14 is removed using the TiN layer 15 as an etch barrier with or without the SRC layer 16 removed. At this time, the etch process is performed using a gas mixture of C$_x$F$_y$/O$_2$/Ar or a gas mixture of C$_x$H$_y$F$_z$/O$_2$/Ar, wherein x, y and z are natural numbers. Thus, nitride patterns 14A are formed to have a vertical profile.

Figure 1F:
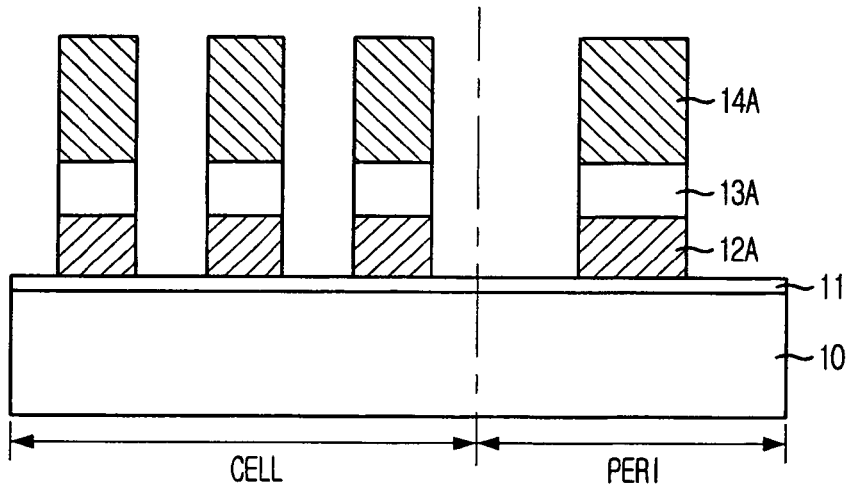

Referring to FIG. 1F, the TiN layer 15 (refer to FIG. 1E) is removed. Then, the gate metal layer 13 and the gate conductive layer 12 are etched using the nitride patterns 14A as an etch barrier. The etch process is performed by using a high density plasma (HDP) etch system such as inductively coupled plasma (ICP), decoupled plasma source (DPS), and electron cyclotron resonance (ECR) systems. One of BCl$_3$, C$_x$F$_y$, NF$_x$, SFx gas and a gas mixture thereof is used. Each of the BCl$_3$, C$_x$F$_y$, NF$_x$ and SFx gases flows at a rate of approximately 10 sccm to approximately 50 sccm. Meanwhile, the Cl$_2$ gas flows at a rate of approximately 50 sccm to approximately 200 sccm. To form the vertical profile, a source power ranging from approximately 500 W to approximately 2,000 W is applied and an additive gas is used, wherein the additive gas includes one of O$_2$ gas flowing at a rate of approximately 1 sccm to approximately 20 sccm, nitrogen (N$_2$) gas flowing at a rate of approximately 1 sccm to approximately 100 sccm, argon (Ar) gas flowing at a rate of approximately 50 sccm to approximately 200 sccm, helium (He) gas flowing at a rate of approximately 50 sccm to approximately 200 sccm, and a gas mixture thereof. Hereinafter, reference numerals of the etched gate metal layer and the etched conductive patterns are changed to 13A and 12A, respectively.

In accordance with another embodiment, after etching the gate metal layer 13 using the nitride patterns 14A, a thin nitride layer, i.e., a capping nitride layer, can be deposited on the resultant structure to prevent an abnormal oxidation of a metal material such as tungsten constituting the gate metal layer 13. That is, when etching the gate metal layer 13 and the gate conductive layer 12 using the nitride patterns 14A, an exposed portion of the gate conductive layer 12 remains having a certain thickness. Then, the capping nitride layer is formed on the sidewalls of the etched gate metal layer 13A and the etched gate conductive layer (not shown). The capping nitride layer is formed using NF$_3$, CF$_4$, SF$_6$, Cl$_2$, O$_2$, Ar, He, HBr or N$_2$ gas, or a gas mixture thereof. Then, the remaining exposed portion of the gate conductive layer is removed by using the nitride patterns 14A on which the capping nitride layer is formed as an etch mask. At this time, Cl$_2$, HBr, O$_2$, or N$_2$ gas is used as an etch gas to obtain a high etch selectivity to the gate insulation layer 11.

Subsequently, a cleaning process is performed by dipping the resultant structure in a dip bath using an ozone (O$_3$) gas with a solvent, a buffered oxide etchant (BOE), and deionized (DI) water. The cleaning process is also performed by using a spin type method.

According to the present invention described above, after reducing the CDs of the hard masks in a region having a relatively high pattern density and a relatively low pattern density, an etch target layer is etched using the hard mask having the reduced CDs as an etch barrier. Thus, it is possible to reduce a FICD of an etch target pattern in the region having a low pattern density.

While the present invention has been described with respect to the specific embodiments, it will be apparent to those skilled in the art that various changes and modifications may be made without departing from the spirit and scope of the invention as defined in the following claims. Particularly, although, in the embodiment of the present invention, a gate is illustrated as an etch target layer, the present invention can be applied to any process for etching etch target layers formed in regions having different pattern densities.

What is claimed is:

1. A method for fabricating a semiconductor device including a first region and a second region, wherein a pattern density of etch target patterns formed in the second region is lower than that of etch target patterns formed in the first region, the method comprising:
   providing a substrate including the first region and the second region;
   forming an etch target layer over the substrate, wherein the etch target layer comprises a stacked layer of a gate insulation layer, a gate conductive layer, a gate metal layer and a gate hard mask layer;
   forming a hard mask layer over the gate hard mask layer;

etching the hard mask layer to form first and second hard mask patterns in the first and the second regions, respectively, wherein the first hard mask pattern has a first width and a first thickness and the second hard mask pattern has a second width larger than the first width and a second thickness same as the first thickness;

forming a photoresist patterns covering the first region and exposing the second region; and etching the second hard mask pattern using the photoresist pattern as an etch mask to form a reduced second hard mask pattern which has a third width smaller than the second width and a third thickness smaller than the second thickness while maintaining the first width and the first thickness of the first hard mask pattern covered by the photoresist pattern, wherein the third width is larger than the first width and the third thickness is smaller than the first thickness.

2. The method of claim 1, wherein the hard mask layer is a single layer or has a stack structure.

3. The method of claim 1, wherein the hard mask layer includes a carbon layer containing silicon.

4. The method of claim 1, wherein forming the first and the second hard mask patterns is performed by using a gas mixture of tetrafluoromethane ($CF_4$) and oxygen ($O_2$), or one of CxFy, CxHyFz, $N_3$, $Cl_2$, and $BCl_3$ gases, or a gas mixture of Cxfy, CxHyFz, $NF_3$, $Cl_2$ and $BCl_3$, x, y and z being natural numbers.

5. The method of claim 3, wherein reducing the width of the second hard mask pattern is performed by an isotropic etch process.

6. The method of claim 5, wherein the isotropic etch process is performed by using a gas mixture of $CF_4$ and $O_2$, or one of CxFy, CxHyFz, $NF_3$, $Cl_2$ and $BCl_3$ gases, or a gas mixture of CxFy, CxHyFz, $NF_3$, $Cl_2$ and $BCl_3$, x, y and z being natural numbers.

7. The method of claim 5, wherein the isotropic etch process is performed by applying a bias power ranging from approximately 100 W to approximately 300 W.

8. The method of claim 1, wherein forming the hard mask layer includes:

forming a mask layer by using one of titanium nitride (TIN), titanium (Ti)/TiN, tetrachlorotitanium ($TiCl_4$), tungsten (W), tungsten nitride (WN), and aluminum oxide ($Al_2O_3$) layers over the etch target layer; and forming a carbon layer containing silicon over the mask layer.

9. The method of claim 1, wherein forming the etch target layer includes:

forming the gate insulation layer over the substrate;

forming the gate conductive layer over the gate insulation layer;

forming the gate metal layer over the gate conductive layer; and forming the gate hard mask layer over the gate metal layer.

10. The method of claim 1, wherein the gate hard mask layer includes a nitride layer.

11. The method of claim 1, wherein the gate metal layer includes one selected from a group consisting of transition metal, rare earth metal, and an alloy of the transition metal and the rare earth metal, or has a stack structure of ones selected from the group.

12. The method of claim 1, wherein the gate metal layer includes oxide material, nitride material, or silicide of transition metal, rare earth metal or an alloy of the transition metal and the rare earth metal.

13. The method of claim 1, wherein the gate metal layer includes a stack structure of a tungsten (W) layer and a tungsten silicide (WSi) layer or a stack structure of a W layer, a tungsten nitride (WN) layer, and a WSi layer.

14. A method for fabricating a semiconductor device including a first region and a second region, the method comprising:

providing a substrate including the first region and the second region;

forming an etch target layer over the substrate;

forming a hard mask layer over the etch target layer;

etching the hard mask layer to form first and second hard mask patterns in the first and the second regions, respectively, wherein the first hard mask pattern has a first width and a first thickness and the second hard mask pattern has a second width larger than the first width and a second thickness same as the first thickness; and etching the second hard mask pattern to form a reduced second hard mask pattern which has a third width smaller than the second width and a third thickness smaller than the second thickness while maintaining the first width and the first thickness of the first hard mask pattern, wherein the third width is larger than the first width and the third thickness is smaller than the first thickness.

* * * * *